(12) United States Patent
Ray

(10) Patent No.: US 6,620,639 B1
(45) Date of Patent: Sep. 16, 2003

(54) APPARATUS TO EVALUATE HOT CARRIER INJECTION PERFORMANCE DEGRADATION AND METHOD THEREFOR

(75) Inventor: S. Doug Ray, Austin, TX (US)

(73) Assignee: Advanced Micro Devices, Austin, TX (US)

( * ) Notice: Subject to any disclaimer, the term of this patent is extended or adjusted under 35 U.S.C. 154(b) by 155 days.

(21) Appl. No.: 09/693,292

(22) Filed: Oct. 19, 2000

(51) Int. Cl.$^7$ ................................................ H01L 21/66
(52) U.S. Cl. ........................................................ 438/18
(58) Field of Search ...................... 702/118; 250/492.21; 372/41; 438/14, 18, 15

(56) References Cited

U.S. PATENT DOCUMENTS 6,175,812 B1 * 1/2001 Boyington .................. 701/118

* cited by examiner

Primary Examiner—John F. Niebling
Assistant Examiner—Andre' C. Stevenson
(74) Attorney, Agent, or Firm—Barry S. Newberger; Winstead Sechrest & Minick P.C.

(57) ABSTRACT

A method and apparatus for evaluating the performance degradation of semiconductor integrated circuit devices due to hot carrier injection (HCI) is implemented. A device under test (DUT) is subject to a sequence of stress cycles. A stress condition is set on the device, for example, an over voltage condition may be applied as the operating voltage of the device. A physical parameter serving as a measure of device performance, for example, the case temperature of the device, is then characterized by varying the physical measure as the DUT executes benchmark cycles until the device fails. Benchmark cycles may be run using conventional benchmark software, or, alternatively, synthetic code. Extrapolation of the data to nominal operating conditions provides a characterization of the expected lifetime of the DUT due to HCI.

7 Claims, 3 Drawing Sheets

US 6,620,639 B1

APPARATUS TO EVALUATE HOT CARRIER INJECTION PERFORMANCE DEGRADATION AND METHOD THEREFOR

TECHNICAL FIELD

The present invention relates in general to data processing devises employing metal oxide semiconductor technology, and in particular, to the degradation of device performance from hot carrier injection into the gate oxide layer of the metal oxide semiconductor transistors.

BACKGROUND INFORMATION

Integrated circuit devices, such as microprocessors, using metal oxide semiconductor transistor technology experience a performance degradation over time due to the injection of hot carriers into the gate insulating oxide layer. As a consequence of the hot carrier injection, the threshold voltage of the MOS transistors increases, with a concomitant decrease in speed of the devices, at a given operating voltage. Typically, a lifetime of the semiconductor device is specified such that over the specified lifetime, the device will operate within the manufacturers specifications for speed and operating voltage. Note that a set of device specifications may trade off performance against other considerations, for example, the device specifications may provide for an increased clock speed at a higher operating voltage (with a quadratic increase in power consumption as a result) or alternatively may provide for reduced speed performance in association with a reduced operating voltage with a concomitant reduction in power consumption.

As performance specifications are increased, the hot carrier injection problem is exacerbated. At higher speeds and associated operating voltages, the injection of hot carriers into the oxide layer increases. Typically, to ensure that an integrated circuit device will operate within the specified voltage and temperature ranges, and at the specified operating frequency over the lifetime of the device, manufacturers characterize the degradation due to HCI using worst case conditions. This results in an excessive safety margin, and generally leads to a clock frequency specification that constrains the specified operating speed of the device significantly below the underlying capabilities of the integrated circuit. Consequently, with an increasing demand for devices with faster speeds, particularly with respect to microprocessors, the need has arisen for improved methods of characterizing HCI induced performance degradation at the chip level.

Chip level degradation may be evaluated using automatic test equipment (ATE) to run a set of patterns repeatedly, and then characterize the degradation of the device over time. However, the ATE is an expensive resource, and the availability of the ATE is limited by demands imposed on ATE facilities by production testing requirements. Additionally, performance degradation evaluation in an ATE environment implicates a large number of static patterns, which must be loaded into the ATE memory, if the device under test (DUT) is to be adequately stressed. Supplying sufficient memory in the ATE may also represent a substantial expense. Consequently, there is a need in the art for apparatus and methods to perform chip level evaluation of HCI performance degradation. The methods and apparatus should alleviate the limitations of the present techniques imposed by cost and time constraints.

SUMMARY OF THE INVENTION

The aforementioned needs are addressed by the present invention. Accordingly, there is provided, in a first form, a method of evaluating data processing devices. The method includes setting a first preselected stress condition on the device. One or more stress cycles are executed on the device. Executing the one or more stress cycles includes executing a first predetermined set of instructions on the device. A first preselected value of a performance parameter of the device, is set on the device and is it determined if the device fails for the first value of the performance parameter.

There is also provided, in a second form, a data processing system. The system includes circuitry operable for setting a first preselected stress condition on the device. One or more stress cycles are executed on the device. The step of executing the one or more stress cycles includes executing a first predetermined set of instructions on the device, by circuitry in the system. Also included is circuitry operable for setting a first preselected value of a performance parameter of the device, and circuitry operable for determining if the device fails for the first value of the performance parameter.

Additionally, there is provided, in a third form, a computer program product embodied in a tangible storage medium, the program product for evaluating data processing devices. The program product includes a program of instructions for setting a first preselected stress condition on the device, and executing one or more stress cycles on the device. Executing the one or more stress cycles includes executing a first predetermined set of instructions on the device. Instructions are also included for setting a first preselected value of a performance parameter of the device. Further instructions determine if the device fails for the first value of the performance parameter.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
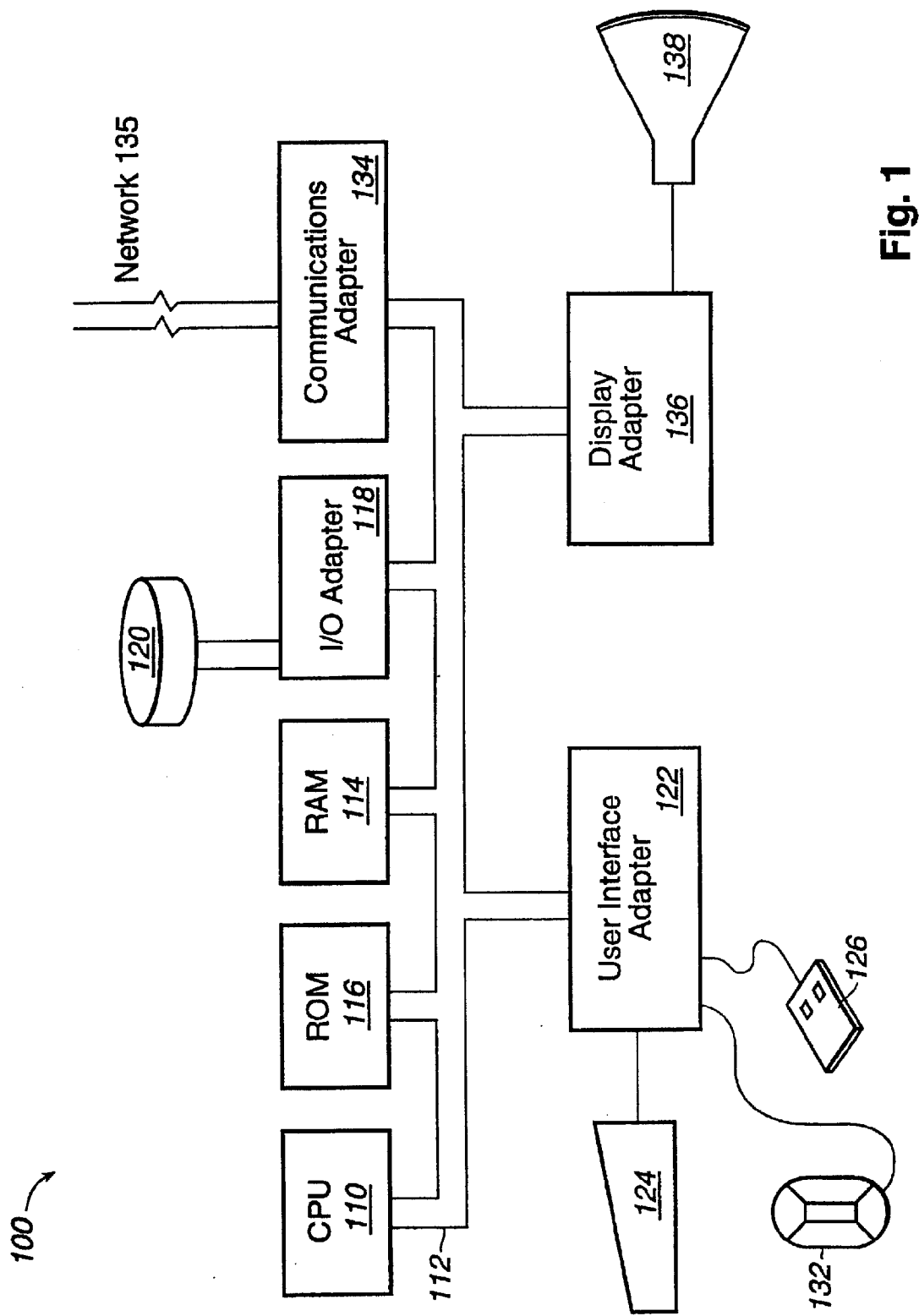
FIG. 1 illustrates, in block diagram form, a data processing system implemented in accordance with an embodiment of the present invention.

The present invention provides a mechanism for characterizing the performance degradation of semiconductor integrated circuit devices due to hot carrier injection (HCI). A device under test (DUT) is subject to a sequence of stress cycles. A physical measure of device performance is then characterized by varying the physical parameter as the DUT executes benchmark cycles until the device fails. Extrapolation of the data to nominal operating conditions provides a characterization of the expected lifetime of the DUT.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, an example is shown of a data processing system 100 which may be used for the invention. The system has a central processing unit (CPU) 110, which is coupled to various other components by system bus 112. Read only memory ("ROM") 116 is coupled to the system bus 112 and includes a basic input/output system ("BIOS") that controls certain basic functions of the data processing system 100. Random access memory ("RAM") 114, I/O adapter 118, and communications adapter 134 are also coupled to the system bus 112. I/O adapter 18 may be a small computer system interface ("SCSI") adapter that communicates with disk storage device 120.

Communications adapter 134 interconnects bus 112 with a network 135 enabling the data processing system to communicate with other such systems.

As will be described in conjunction with FIG. 3, a data processing system such as system 100 may serve as a host system, and one or more additional system 100, adapted as described below, may serve as slave systems. The host system and slave system(s) may be interconnected by network 135.

Input/Output devices are also connected to system bus 112 via user interface adapter 122 and display adapter 136. Keyboard 124, track ball 132, mouse 126 and speaker 128 are all interconnected to bus 112 via user interface adapter 122. Display monitor 138 is connected to system bus 112 by display adapter 136. In this manner, a user is capable of inputting to the system throughout the keyboard 124, trackball 132 or mouse 126 and receiving output from the system via speaker 128 and display 138.

Preferred implementations of the invention include implementations as a computer system programmed to execute the method or methods described herein, and as a computer program product. According to the computer system implementation, sets of instructions for executing the method or methods are resident in the random access memory 114 of one or more computer systems configured generally as described above. Until required by the computer system, the set of instructions may be stored as a computer program product in another computer memory, for example, in disk drive 120 (which may include a removable memory such as an optical disk or floppy disk for eventual use in the disk drive 120). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Figure 2:
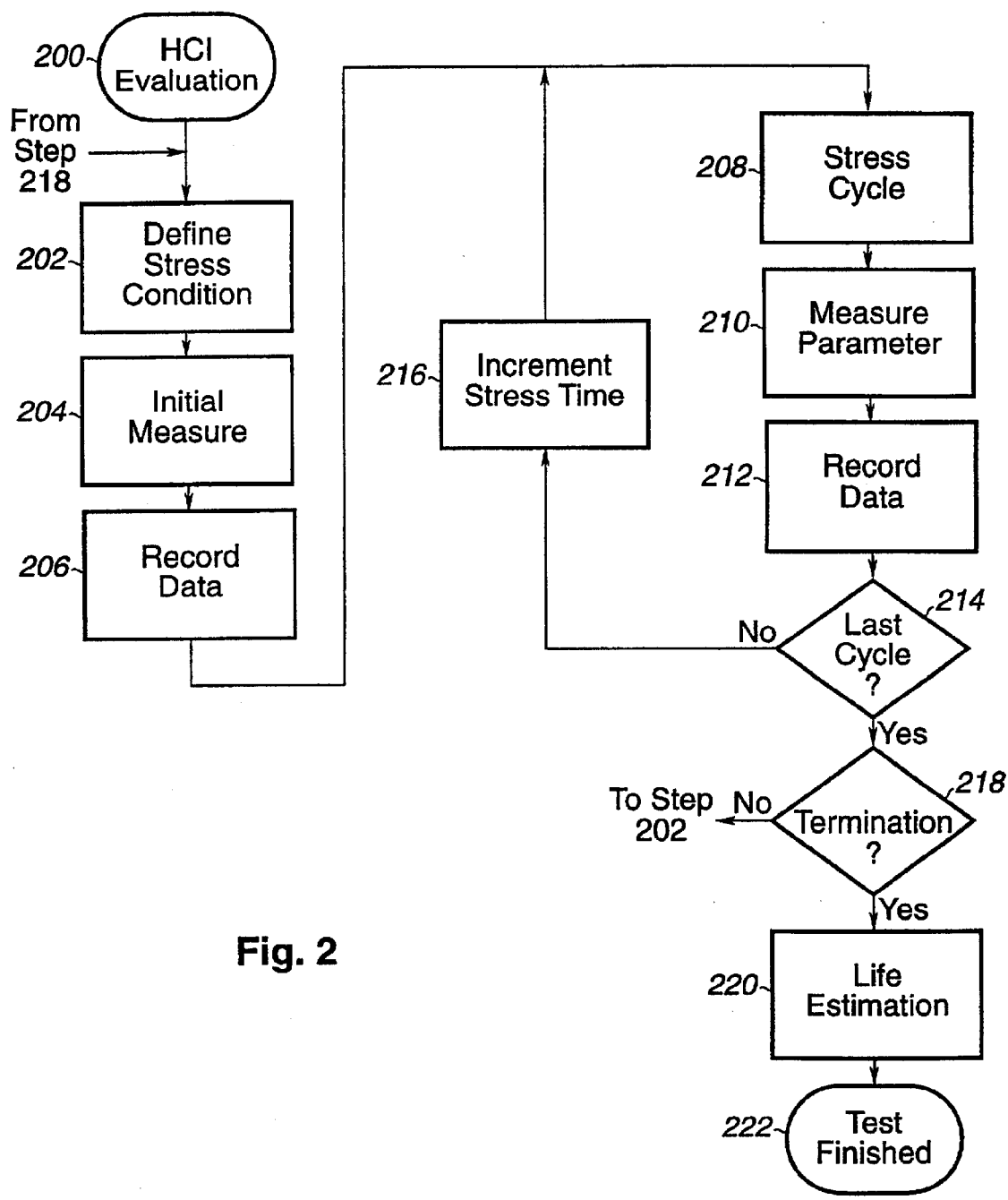
FIG. 2 illustrates, in flow chart form, a methodology for evaluating hot carrier induced degradation which may be used in the present invention.

Refer now to FIG. 2 illustrating, in flow chart form, methodology 200 for evaluating hot carrier injection (HCI) induced degradation of a semiconductor device, which may be incorporated in the present invention. In step 202, a stress condition is defined. Typical HCI rates give rise to performance degradation which may limit device useful lifetimes, but which may be too slow to be observed in a test environment at nominal operating parameters of the DUT. Thus, in step 202, a value of the stress parameter must be chosen such that HCI rates are accelerated. For example, the operating voltage supplied to the DUT may be raised to a value that exceeds the nominal supply voltage specification for the device. Thus, by way of illustration, a device nominally specified to operate at 2.0 V may be stressed at 2.7 V for HCI evaluation. (It would be understood by an artisan of ordinary skill that these values are exemplary and other voltages may be used in conjunction with the present invention and such embodiments would be within the spirit and scope thereof) Additionally, the process steps in methodology 200, to be described herein, may be repeated for a plurality of stress levels to determine the acceleration of HCI induced degradation with increasing device stress. Thus, continuing the example above, a series of stress cycles may be performed at several voltages, say 2.7 V, 2.6V, 2.5V and 2.4V.

In step 204, an initial measurement of a predetermined parameter which serves as an indicator of device performance is made. Performance parameters which may be used in step 204 include a maximum clock frequency of the DUT, and the maximum case temperature of the DUT. That is, a particular DUT will have a maximum clock frequency at which the device will function without error. Similarly, as the case temperature of a particular DUT is increased, a case temperature will be reached at which the device fails to perform without error. As a device accumulates injected hot carriers, the device performance degrades as reflected in, for example, a decreasing maximum clock frequency or a decreasing maximum case temperature. In step 206 the data resulting from the initial measurement in step 204 is recorded.

In step 208, the DUT is run through a stress cycle. This may be performed, for example, by driving patterns on the DUT in an automatic test equipment (ATE) environment as previously described. Alternatively, a stress cycle may be performed by executing a predetermined program of instructions thereon. A process which embodies the latter such stress cycles will be described in detail in conjunction with FIG. 3.

In step 210, the parameter selected to characterize the device performance, as discussed in step 204, is measured, and the data recorded in step 212. If, the last stress cycle has not been performed, step 214, the stress time is incremented in step 216 and methodology 200 returns to step 208 to run another stress cycle. The process then loops through steps 208–216 to record the performance degradation of the DUT as a function of time as HCI accumulates. After a predetermined number of stress cycles, or, equivalently, a predetermined duration of HCI accumulation methodology 200 exits the loop over steps 208–216 via the "Yes" branch of step 214.

As discussed hereinabove, typical HCI degradation rates while significant over the useful lifetime of a semiconductor device are, in a commercially acceptable device, too slow to be readily observed in a test environment. Therefore, stress conditions that accelerate the degradation rate are typically employed. To extrapolate to nominal stress conditions, process 200 loops over a set of selected stress conditions, and in step 218 it is determined if the last stress condition has been evaluated. If not, methodology 200 returns to step 202 and the next stress condition to be evaluated is set. Otherwise, step 218 proceeds by the "Yes" branch and in step 220 the data recorded in steps 206 and 212 are used to extrapolate a DUT lifetime. Techniques for extrapolating from a set of data, which may be used in step 220, are known in the data analysis art. See e.g., William H. Press, et al., Numerical Recipes, ch. 3, pp. 77–86 (1986). In step 222, methodology 200 terminates.

Figure 3:
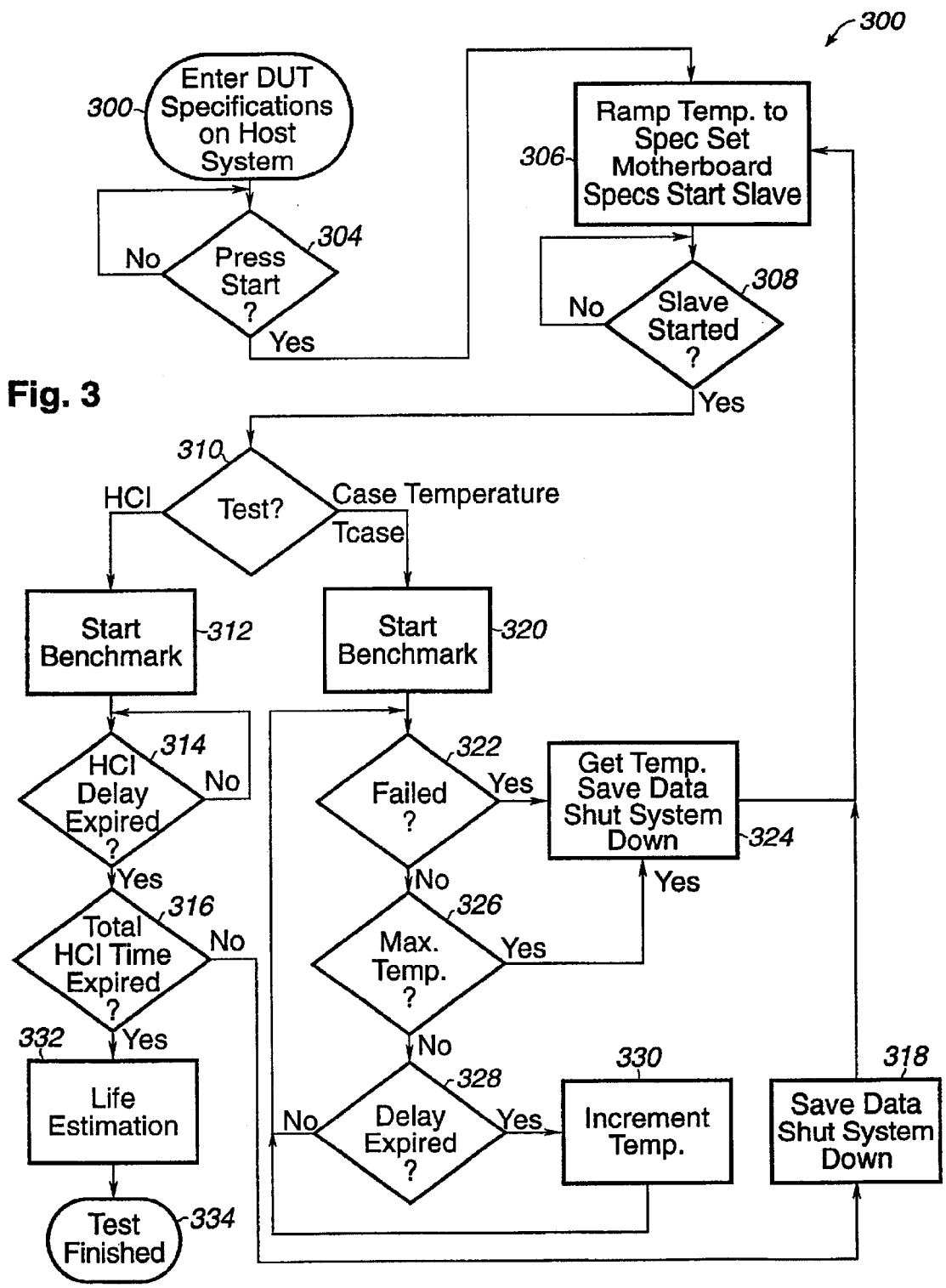
FIG. 3 illustrates, in flow chart form, a system level HCI degradation methodology in accordance with an embodiment of the present invention.

Referring now to FIG. 3, there is illustrated therein, in flow chart form, process 300 which embodies the principles of methodology 200. Process 300 may be performed by a host data processing system implemented in accordance with system 100 of FIG. 1 in conjunction with one or more slave data processing systems coupled thereto via network 135, FIG. 1. The slave systems may also be implemented using a data processing system 100 substantially as shown in FIG. 1 in which a motherboard in CPU 110, FIG. 1 includes the DUT. Additionally, the motherboard (not shown in FIG. 1 for simplicity) includes apparatus for controlling the device parameter used to characterize the performance degradation of the DUT. As will be discussed further hereinbelow, in process 300, this may be the case temperature of the DUT. This apparatus controls the characterization parameter in response to signals from the host data processing system. In an embodiment in which the case temperature is used as the characterization parameter, an active cooling system controlled by the host system may be incorporated on the motherboard. Note that data processing system 100 may embody a conventional personal computer (PC) or workstation.

In step 302, the host system receives the DUT specifications via user input, and waits for user input to start the current test, step 304. In response to user input to start the current test, in step 306, the case temperature of the DUT is selected (which may be an initial value for the test sequence to be discussed, for example 25° C.), the motherboard specifications are set, and the slave system is started. Additionally, the supply voltage to the DUT may be set, and the system may set the clock frequency based on the speed grade of the DUT. Step 306 may be performed by the host system by sending a set of corresponding command signals via network, such as network 135, FIG. 1. Network 135 maybe a serial link between the host system and each slave via a corresponding serial interface on the host system, such as an RS-232 port. Alternatively, a daisy-chained serial interface, for example, Universal Serial Bus (USB) link may be used. In another embodiment, network 135 may be a local area network (LAN) architecture, for example Ethernet. An artisan of ordinary skill would recognize that the practice of the principles of the present invention is not constrained by the particular architecture used to provide network 135.

Instep 308, process 300 loops until the slave system is started. Instep 310, process 300 selects between a stress cycle, and a case temperature characterization. If, the current pass through the test loop is the initial pass, then a base line case temperature characterization is performed, and process 300 proceeds by the "case temperature" branch in step 310. (Thus, the initial pass through the temperature characterization steps 320–330, discussed further below, may correspond to step 204, FIG. 2.) On subsequent passes, the DUT may selectively be subject to stress cycles and case temperature characterization. If a stress cycle is to be performed, step 310 proceeds by the "HCI" branch and a benchmark is initiated, step 312. The benchmark includes instructions for performing a set of operations by the DUT. For example, if the DUT is a microprocessor, the benchmark may be commercially available processor benchmarking software, such as CPUmark 32. (CPUmark32 is a product of eTesting Labs, formally, Ziff-Davis Labs, and is a subsystem-level test which is designed to measure the speed of the CPU internal cache, external cache, and system memory.) Alternatively, synthetic code may be run in step 312. Note that step 312 may be performed by a slave system containing the DUT, as discussed hereinabove. In step 314, process 300 loops until a preselected HCI delay times out. In this way, a preselected stress duration is provided. In step 316, it is determined if a total HCI degradation evaluation has been completed. Recall, as discussed hereinabove in conjunction with methodology 200, FIG. 2, the accumulation of degradation as a function of time may be evaluated using the present invention.

Assuming first, that the total HCI degradation time is not expired, step 316 proceeds by the "No" branch, and data is saved in step 318. The slave system is also shut down and process 300 returns to step 306 to prepare for the next portion of the operation. In step 306, the temperature is set to a preselected value, motherboard specifications are set, for example, for a case temperature characterization, the voltage may be returned to the nominal voltage specification for the DUT. The case temperature is maintained at the selected value by the temperature control apparatus on the motherboard. A thermal sensor is affixed to the case of the DUT and a cooling system provided on the motherboard is controlled by the host system to keep the case temperature at the selected value. As before, the slave system is started in step 308.

Assume now, in step 310, that a case temperature characterization is to be performed to evaluate the performance degradation resulting from the HCI induced by the stress phase, steps 312–316 previously discussed. In step 320, execution of the benchmark is started. Note that the benchmark executed in step 320 need not necessarily be the same as that run in step 312, although they may, in an embodiment of the present invention, be the same. The benchmark runs until either the DUT fails, or the device performs satisfactorily at the current case temperature for a time interval sufficient to establish that the case temperature has equilibrated. The aforementioned thermal sensor on the DUT and the cooling system controlled by the host system maintains the case temperature at the temperature selected for characterization. Thus, in step 322, if the device fails at the current case temperature, then in step 324 the temperature is retrieved, data saved and the slave system shuts down. Process 300 then returns to step 306. A failure of the DUT may be determined by detecting an invalid response of the DUT to one or more of the instructions in the benchmark. The failure of the DUT may be detected by the benchmark software itself trapping an error and returning an error message by the corresponding slave to the host. Additionally, a failure may cause the corresponding slave to hang or crash. This may be determined by detecting a time-out of the slave system. After each cycle of the benchmark, software is run that communicates with the host system. If after a predetermined time interval, the slave fails to communicate with the host, it is determined that the DUT has failed. If the DUT has not failed at the current case temperature, in step 326 it is determined if the current selected case temperature corresponds to a preselected maximum value. If not, process 300 determines in step 328 if a preselected delay has expired. If not, process 300 returns to step 322. Thus, steps 322–328 form a timing loop that ensures that the benchmark runs on the DUT for a selected time interval such that the case temperature of the DUT equilibrates. After the benchmark has been run for the preselected equilibration time without failure of the DUT (step 322), in step 330 the case temperature is incremented as process 300 breaks out of the timing loop via the "Yes" path in step 328. The case temperature may, in step 330, be incremented by a predetermined value. Process 300 then continues with the temperature characterization at the incremented case temperature by returning to step 322. Again, the benchmark is run at the incremented temperature for the duration of the timing loop, steps 322–328, or device failure in step 322.

Process 300 repeats the incrementing of the case temperature until the DUT fails, or the preselected maximum temperature has been reached, wherein, in step 326, process 300 breaks out of the loop via the "Yes" path of step 326. In step 324 the temperature is recorded, and process 300 returns to step 306. Process 300 may then continue with additional HCI accumulation by returning to step 310, and selecting for the "HCI" branch therefrom.

Returning to step 316, once the preselected total HCI has been accumulated, then in step 332 a lifetime specification may be determined as discussed hereinabove in conjunction with step 220, FIG. 2, and the test terminated in step 334.

In this way, a system level HCI performance degradation evaluation may be provided. Degradation rates are accelerated by performing a preselected set of stress events on the DUT. As HCI degradation accumulates, a selected physical parameter of the device, which parameter provides a measure of the performance degradation of the DUT, is characterized. Degradation rates may be extrapolated to nominal specifications for the device under test to determine an estimated lifetime of the device.

Although the present invention and its advantages have been described in detail, it should be understood that various changes, substitutions and alterations can be made herein without departing from the spirit and scope of the invention as defined by the appended claims.

What is claimed is:

1. A method of evaluating data processing devices comprising the steps of:

setting a first preselected stress condition on said device;

executing one or more stress cycles on said device, wherein said step of executing said one or more stress cycles includes executing a first predetermined set of instructions on said device;

setting a first preselected value of a performance parameter of said device; and determining if said device fails for said first value of said performance parameter.

2. The method of claim 1 wherein said step of determining if said device fails comprises the steps of:

executing a second predetermined set of instructions on said device; and detecting an invalid response of said device to at least one instruction of said second predetermined set of instructions.

3. The method of claim 1 further comprising the steps of:

if said device did not fail, incrementing said preselected value of said performance parameter of said device to generate a second value of said performance parameter; and determining if said device fails for said second value of said performance parameter.

4. The method of claim 1 further comprising the steps of:

setting a second preselected stress condition on said device; and repeating said steps of executing one or more stress cycles on said device, setting said first preselected value of a performance parameter of said device and determining if said device fails for said first value of said performance parameter.

5. The method of claim 4 further comprising the step of determining a device lifetime in response to said steps of setting a first preselected stress condition on said device, executing one or more stress cycles on said device, setting a first preselected value of a performance parameter of said device, determining if said device fails for said first value of said performance parameter, setting a second preselected stress condition on said device, and repeating said steps of executing one or more stress cycles on said device, setting said first preselected value of a performance parameter of said device and determining if said device fails for said first value of said performance parameter.

6. The method of claim 1 wherein said performance parameter comprises a case temperature of said device.

7. The method of claim 1 wherein said step of setting said first preselected stress condition includes the step of communicating a signal corresponding to said first preselected stress condition from a host system to a slave system, said slave system operable for controlling said first preselected stress condition and executing said one or more stress cycles on said device.

* * * * *